United States Patent
Kim et al.

(10) Patent No.: US 12,520,706 B2
(45) Date of Patent: Jan. 6, 2026

(54) METHOD OF MANUFACTURING DISPLAY APPARATUS USING A REMOVABLE DAM TO FORM ORGANIC LAYER ON DISPLAY AREA AND DISPLAY APPARATUS MANUFACTURED THROUGH THE METHOD

(71) Applicant: Samsung Display Co., Ltd., Yongin-Si (KR)

(72) Inventors: Sujeong Kim, Yongin-si (KR); Younggu Kim, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 409 days.

(21) Appl. No.: 18/110,272

(22) Filed: Feb. 15, 2023

(65) Prior Publication Data
US 2023/0363242 A1 Nov. 9, 2023

(30) Foreign Application Priority Data
May 9, 2022 (KR) .................... 10-2022-0056882

(51) Int. Cl.
*H10K 59/80* (2023.01)
*H10K 59/12* (2023.01)

(52) U.S. Cl.
CPC ....... *H10K 59/873* (2023.02); *H10K 59/1201* (2023.02)

(58) Field of Classification Search
CPC .................... H10K 59/873; H10K 59/1201
See application file for complete search history.

(56) References Cited

U.S. PATENT DOCUMENTS

| | | | | |
|---|---|---|---|---|
| 8,034,517 B2 * | 10/2011 | Tsao | ................. | G02B 5/201 |
| | | | | 430/7 |
| 8,988,762 B2 | 3/2015 | Shin et al. | | |
| 11,289,678 B2 | 3/2022 | Long | | |
| 2003/0118921 A1 * | 6/2003 | Chen | ................. | G02B 5/201 |
| | | | | 430/7 |
| 2005/0157157 A1 * | 7/2005 | Tsukamoto | ........... | G02B 5/201 |
| | | | | 347/213 |
| 2006/0008713 A1 * | 1/2006 | Toyoda | ................. | G02B 5/223 |
| | | | | 430/7 |
| 2010/0140595 A1 * | 6/2010 | Lee | ................... | H10K 59/8722 |
| | | | | 257/40 |

(Continued)

FOREIGN PATENT DOCUMENTS

KR 10-1350425 B1 1/2014
KR 10-2014-0104608 A 8/2014

(Continued)

*Primary Examiner* — Michael Jung
(74) *Attorney, Agent, or Firm* — Innovation Counsel LLP

(57) ABSTRACT

Provided is a method of manufacturing a display apparatus including a substrate and a light-emitting diode, wherein the substrate includes a display area and a peripheral area outside the display area, and the light-emitting diode is arranged in the display area, and a display apparatus manufactured through the method. The method includes forming a dam in the peripheral area, the dam including a photodegradable material, forming an organic layer in an inner region of the dam, the organic layer including a photocurable material, and removing the dam.

18 Claims, 17 Drawing Sheets

(56) References Cited

U.S. PATENT DOCUMENTS

2013/0329274 A1* 12/2013 Yang .................... G02B 26/005
                                                        359/290
2018/0097198 A1*  4/2018 Chou ................. H10K 50/8426
2019/0305244 A1* 10/2019 Jiang ..................... H10K 71/00

FOREIGN PATENT DOCUMENTS

KR         10-1684861 B1    12/2016
KR     10-2020-0015522 A     2/2020

* cited by examiner

METHOD OF MANUFACTURING DISPLAY APPARATUS USING A REMOVABLE DAM TO FORM ORGANIC LAYER ON DISPLAY AREA AND DISPLAY APPARATUS MANUFACTURED THROUGH THE METHOD

CROSS-REFERENCE TO RELATED APPLICATION

This application is based on and claims priority under 35 U.S.C. § 119 to Korean Patent Application No. 10-2022-0056882, filed on May 9, 2022, in the Korean Intellectual Property Office, the disclosure of which is incorporated by reference herein in its entirety.

BACKGROUND

1. Field

The present disclosure generally relates to a display apparatus. More particularly, the present disclosure relates to a method of manufacturing a display apparatus and a display apparatus manufactured through the method.

2. Description of the Related Art

Recently, the usage of display apparatuses has diversified. In addition, as display apparatuses have become thinner and lighter, their range of use has been gradually extended.

Generally, a display apparatus includes thin-film transistors and light-emitting diodes (e.g., organic light-emitting diodes) arranged over a substrate, and the light-emitting diodes emit light. The display apparatus is used as a display unit of miniaturized products such as mobile phones, and also used as a display unit of large-scale products such as televisions.

The display apparatus may include a display area and a peripheral area, wherein the display area is configured to display images, and the peripheral area is configured not to display images. Recently, research has been actively carried out to reduce the area of the peripheral area and increase the display area, wherein a circuit portion of a display apparatus and the like are arranged in the peripheral area.

SUMMARY

One or more embodiments include a method of manufacturing a display apparatus with a reduced defect rate and an increased display area during a manufacturing process, and a display apparatus manufactured through the method. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a method of manufacturing a display apparatus including a substrate and a light-emitting diode, wherein the substrate includes a display area and a peripheral area outside the display area, and the light-emitting diode is arranged in the display area, the method includes forming a dam in the peripheral area, the dam including a photodegradable material, forming an organic layer in an inner region of the dam, the organic layer including a photocurable material, and removing the dam.

The forming of the dam may include coating the substrate with a dam-forming material, the dam-forming material including the photodegradable material, and forming a pattern, and drying the dam-forming material that is patterned.

The coating of the substrate and the forming of the pattern may be performed by using line drawing or a silk screen method.

The coating of the substrate and the forming of the pattern may include coating the substrate with the dam-forming material and irradiating light, by using a mask, to the dam-forming material that is coated.

The dam may surround the display area along edges of the display area in a plan view.

The dam may have a surface shape including an opening corresponding to the display area in a plan view.

The forming of the organic layer may be performed by using an inkjet method.

The forming of the organic layer may include injecting an organic layer-forming material in the inner region of the dam, the organic layer-forming material including a photocurable material, and irradiating light and curing the organic layer-forming material that is injected.

The organic layer may be disposed over the light-emitting diode and may cover the display area entirely.

The photocurable material may include a negative photoresist.

The photodegradable material may include a positive photoresist.

The removing of the dam may include decomposing the dam by irradiating light thereon, and removing the dam that is decomposed.

The removing of the dam may be simultaneously performed with the curing of the organic layer-forming material.

The thickness of the dam may be about 0.8 times to about 10 times a thickness of the organic layer.

The display apparatus may further include a first inorganic encapsulation layer covering the light-emitting diode, a second inorganic encapsulation layer on the first inorganic encapsulation layer, and an organic encapsulation layer between the first inorganic encapsulation layer and the second inorganic encapsulation layer, wherein the organic layer may include the organic encapsulation layer.

The organic layer may include a first organic layer and a second organic layer directly disposed on the first organic layer, wherein the forming of the organic layer may include forming the first organic layer and forming the second organic layer on the first organic layer.

The forming of the first organic layer may include injecting a first organic layer-forming material in the inner region of the dam, the first organic layer-forming material including a photocurable material, and irradiating light to cure the first organic layer-forming material that is injected, wherein the forming of the second organic layer may include injecting a second organic layer-forming material in the inner region of the dam, the second organic layer-forming material including a photocurable material, and irradiating light to cure the second organic layer-forming material that is injected.

The curing of the first organic layer-forming material may include preparing a mask including a light transmissive region and a light-blocking region, aligning the mask such that the light transmissive region corresponds to the first organic layer-forming material, and the light-blocking region corresponds to the dam, and irradiating light.

The removing of the dam may include decomposing the dam by irradiating light, and removing the dam that is decomposed, wherein the decomposing of the dam may be simultaneously performed with the curing of the second organic layer-forming material.

According to one or more embodiments, a display apparatus manufactured by the manufacturing method according to one of the embodiments, is provided.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
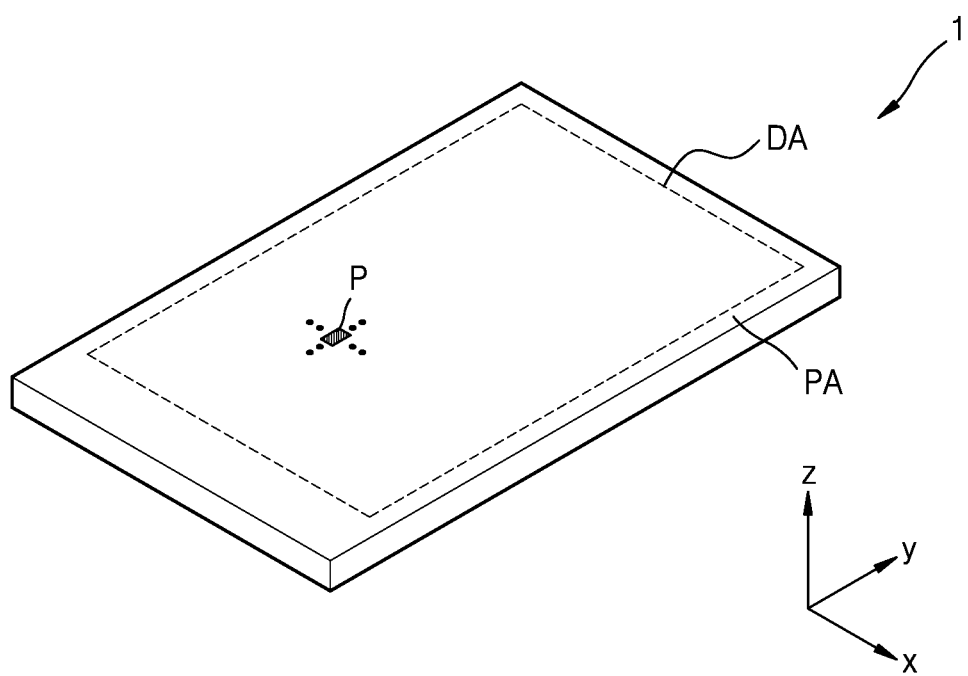
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

In the present specification, "A and/or B" means A or B, or A and B. In the present specification, "at least one of A and B" means A or B, or A and B.

As used herein, "on a plan view" means that an objective portion is viewed from above, and "on a cross-sectional view" means that a cross-section of an objective portion taken vertically is viewed from a lateral side. As used herein, "overlapping" includes overlapping "in a plan view" and "in a cross-sectional view."

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, embodiments of the present disclosure are described in detail with reference to the accompanying drawings. When description is made with reference to the drawings, like reference numerals are used for like or corresponding elements.

FIG. 1 is a schematic perspective view of a display apparatus 1 according to an embodiment.

Referring to FIG. 1, the display apparatus 1 includes a display area DA and a peripheral area PA extending outside the display area DA.

The display area DA is a region in which images are displayed, and a plurality of sub-pixels P may be arranged in the display area DA. Each sub-pixel P may include a light-emitting element such as an organic light-emitting diode. Each sub-pixel P may emit, for example, red, green, blue, or white light. The display apparatus 1 may display images to the outside by using light emitted from the display area DA.

The peripheral area PA is a region in which images are not displayed and sub-pixels are not arranged. A power supply line, a printed circuit board, or a terminal portion may be arranged in the peripheral area PA. The power supply line may drive sub-pixels P, the printed circuit board may include a driving circuit portion, and a driver integrated circuit (IC) may be connected to the terminal portion.

The display area DA of the display apparatus 1 shown in FIG. 1 is a quadrangle, however, the embodiment is not limited thereto. The display area DA may have a circular shape, an elliptical shape, or a polygonal shape such as a triangle or a pentagon. In addition, although the display apparatus 1 shown in FIG. 1 has a flat shape, the display apparatus 1 may be implemented in various shapes such as a flexible, foldable, and rollable display apparatus.

Figure 3A:
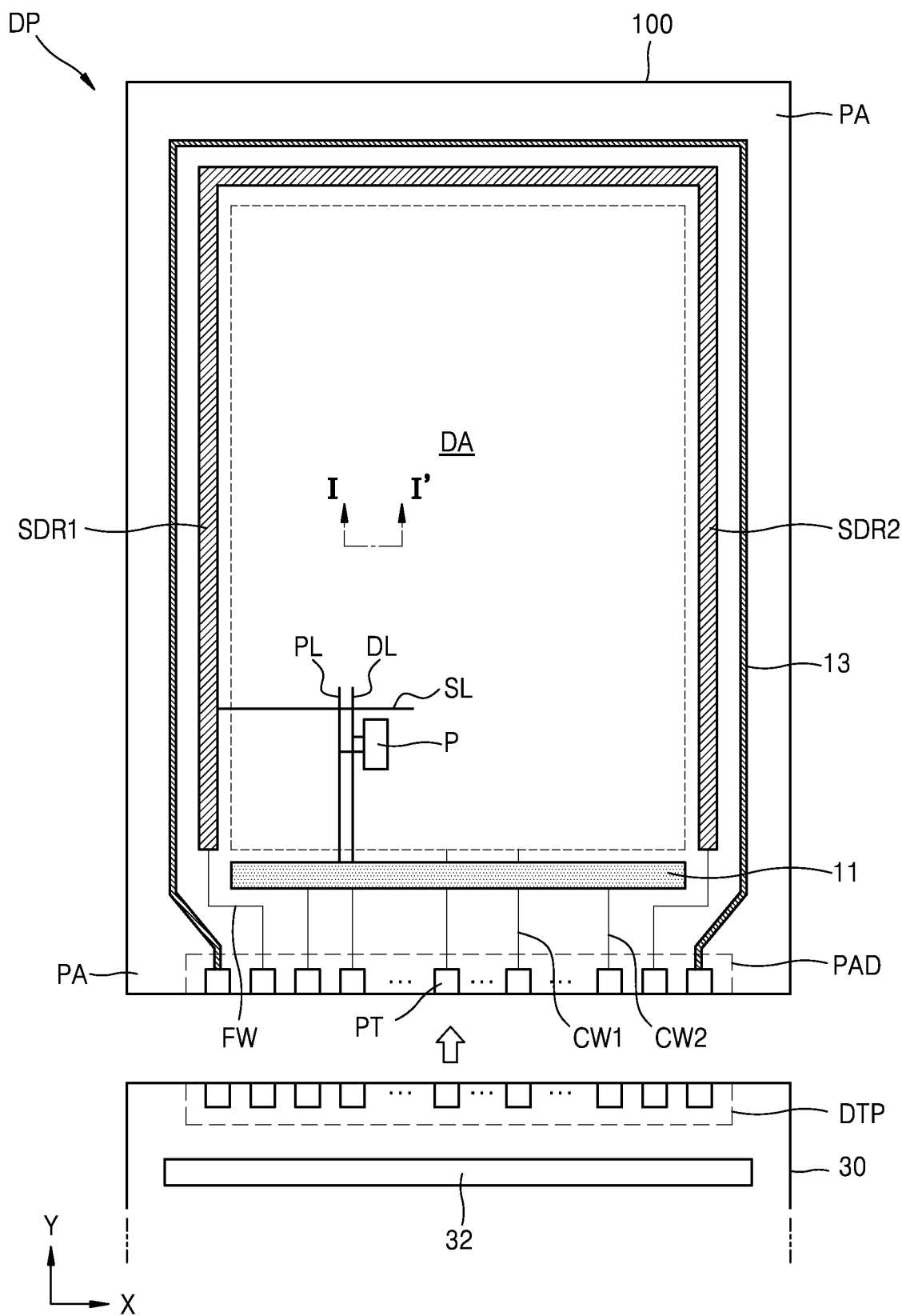
FIGS. 3A and 3B are schematic plan views of display panels according to an embodiment.

Though not shown, the display apparatus 1 may include a component (not shown) located on one side of a display panel DP (see FIG. 3A). The component may be an electronic element that uses light or sound. As an example, the electronic element may include a sensor such as an infrared sensor that uses light, a camera that receives light to capture an image, a sensor that outputs and senses light or sound to measure a distance or recognize a fingerprint, a small lamp that outputs light, and a speaker that outputs sound.

Hereinafter, though an organic light-emitting display apparatus is described as an example of the display apparatus 1, the display apparatus according to an embodiment is not limited thereto. In another embodiment, the display apparatus 1 according to an embodiment may be an inorganic light-emitting display apparatus or a quantum-dot light-emitting display apparatus. As an example, an emission layer of a light-emitting diode provided to the display apparatus 1 may include an organic material, an inorganic material, quantum dots, an organic material and quantum dots, or an inorganic material and quantum dots.

Figure 2:
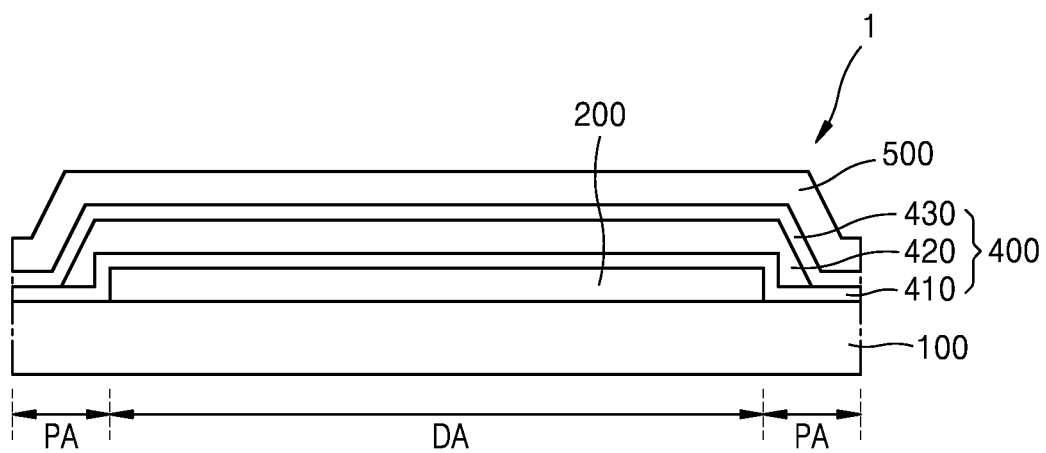
FIG. 2 is a schematic cross-sectional view of the display apparatus according to an embodiment.

FIG. 2 is a schematic perspective view of the display apparatus 1 according to an embodiment.

Referring to FIG. 2, the display apparatus 1 includes a display layer 200, an encapsulation layer 400, and an upper structure 500, wherein the display layer 200 is disposed on the substrate 100, the encapsulation layer 400 covers the display layer 200, and the upper structure 500 is disposed on the encapsulation layer 400. In this example, the encapsulation layer 400 entirely covers the display layer 200. However, this is an example, and the embodiment is not limited thereto.

The substrate 100 may include glass or a polymer resin. As an example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin is flexible, rollable, or bendable. The substrate 100 may have a single-layered structure or a multi-layered structure, and may further include an inorganic layer (not shown) in the case of the multi-layered structure. The substrate 100 includes the display area DA and the peripheral area PA outside the display area DA.

The display layer 200 may be disposed on the substrate 100. The display layer 200 may include a plurality of sub-pixels. Each sub-pixel may include a light-emitting diode, for example, an organic light-emitting diode, and a sub-pixel circuit electrically connected to the organic light-emitting diode. The sub-pixel circuit may include a thin-film transistor, a storage capacitor, and insulating layers therebetween.

The display layer 200 may be sealed by the encapsulation layer 400. Because the organic light-emitting diode is vulnerable to moisture and oxygen due to external air, the organic light-emitting diode may be blocked from external air and moisture by sealing the organic light-emitting diode using the encapsulation layer 400. The encapsulation layer 400 may improve the reliability of the display apparatus 1 by protecting the sub-pixels from external air.

The encapsulation layer 400 may include at least one inorganic encapsulation layer and at least one organic encapsulation layer. Though the encapsulation layer 400 of FIG. 2 includes a first inorganic encapsulation layer 410, a second inorganic encapsulation layer 430, and an organic encapsulation layer 420 disposed therebetween, the embodiment is not limited thereto. The encapsulation layer 400 may be provided as one body to cover the display area DA entirely, and may extend to the peripheral area PA outside the display area DA. The encapsulation layer 400 may be provided to cover, for example, a portion or all of first and second scan driving circuits SDR1 and SDR2, a driving voltage supply line 11, and a common voltage supply line 13. The first inorganic encapsulation layer 410 may directly contact the second inorganic encapsulation layer 430 in the peripheral area PA. A lateral surface of the organic encapsulation layer 420 may be covered by the second inorganic encapsulation layer 430.

In an embodiment, an encapsulation substrate (not shown) including glass may be provided instead of the encapsulation layer 400. The encapsulation substrate may be disposed on the display layer 200, and the display layer 200 may be disposed between the substrate 100 and the encapsulation substrate. There may be a gap between the encapsulation substrate and the display layer 200. A filling material may fill the gap.

The upper structure 500 may be further disposed on the encapsulation layer 400. Though not shown, the upper structure 500 may include an optical layer and at least one of a color filter layer, an input sensing layer, an anti-reflection layer, and a window layer on the optical layer. However, the embodiment is not limited thereto. In addition, though it is shown in FIG. 2 that the upper structure 500 extends from the display area DA to the peripheral area PA, a portion of the upper structure 500 may be arranged in only the display area DA.

In an embodiment, the upper structure 500 may include an anti-reflection layer. The anti-reflection layer may include a polarizer. Alternatively, the anti-reflection layer may include color filters of different colors, for example, a red color filter, a green color filter, and/or a blue color filter, and an overcoat layer covering the color filters entirely. The overcoat layer may be arranged to the display area DA entirely, and may extend to the peripheral area PA. The overcoat layer may include an organic material. As an example, the overcoat layer may include a light transmissive organic material such as acryl-based resin.

In an embodiment, the upper structure 500 may include an optical layer and a color filter layer thereon, wherein the optical layer is configured to convert a color of light emitted from the display layer 200 or transmit the light without converting the color of the light. The optical layer may include a quantum-dot layer and a transmissive layer, wherein the quantum-dot layer is configured to convert light emitted from the display layer 200 to light of a different color, and the transmissive layer is configured to transmit light emitted from the display layer 200 without converting the color of the light. The color filter layer may include color filters of different colors, for example, a red color filter, a green color filter, and a blue color filter. In this case, the upper structure 500 may further include an overcoat layer covering the color filter layer.

Figure 3B:
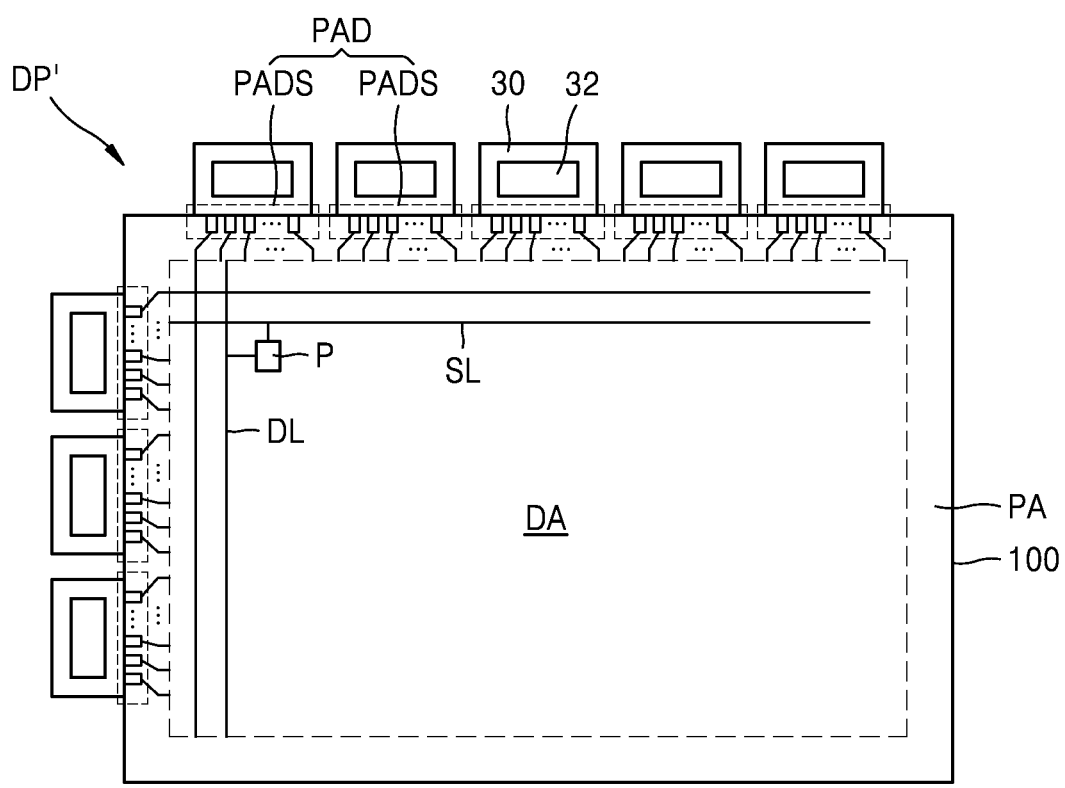

FIGS. 3A and 3B are schematic plan views of display panels DP and DP' according to an embodiment.

Referring to FIG. 3A, the display apparatus 1 may include the display panel DP. The display panel DP includes the display area DA and the peripheral area PA surrounding the display area DA. The display panel DP may be configured to display images by using light emitted from a plurality of sub-pixels arranged in the display area DA.

The display area DA may include the plurality of sub-pixels P, wherein the plurality of sub-pixels P are connected to data lines DL extending in a y direction, and scan lines SL extending in an x direction crossing the y direction. Each sub-pixel P may be connected to a driving voltage line PL extending in the y direction.

Each of the plurality of sub-pixels P may include a light-emitting diode, for example, an organic light-emitting diode. Each sub-pixel P may emit red, green, blue, or white light by using a light-emitting diode. In an embodiment, all of the light-emitting diodes included in the plurality of sub-pixels P may be configured to emit light of the same color, and the colors of the respective sub-pixels P may be implemented different by the color filters and the like disposed on the light-emitting diodes.

Each sub-pixel P may be electrically connected to a plurality of circuits arranged in the peripheral area PA. As an example, the first scan driving circuit SDR1, the second scan driving circuit SDR2, the driving voltage supply line 11, the common voltage supply line 13, and a pad portion PAD may be arranged in the peripheral area PA.

The first scan driving circuit SDR1 may be configured to apply a scan signal to a circuit driving the sub-pixel P through the scan line SL. The second scan driving circuit SDR2 may be arranged symmetrical with the first scan driving circuit SDR1 around the display area DA. Some of the sub-pixels P may be electrically connected to the first scan driving circuit SDRV1, and the rest may be electrically connected to the second scan driving circuit SDRV2.

The driving voltage supply line 11 may be arranged on one side of the display area DA, for example, the lower end of the display panel DP. The driving voltage supply line 11 may extend in the x direction. The driving voltage supply line 11 may be connected to a plurality of driving voltage lines PL configured to transfer a driving voltage ELVDD to the sub-pixels P.

The common voltage supply line 13 may have a loop shape having one open side so that the common voltage supply line 13 may partially surround the display area DA. The common voltage supply line 13 may be connected to the sub-pixel circuit of the sub-pixel P and configured to provide a common voltage ELVSS to an opposite electrode.

The pad portion PAD may be arranged on one side of the substrate 100 and may include a plurality of pad terminals PT. Each pad terminal PT may be connected to a first connection line CWL1 or a second connection line CWL2, and the like, wherein the first connection line CWL1 extends to the display area DA, and the second connection line CWL2 is connected to the driving voltage supply line 11. Each pad terminal PT may be exposed by not being covered by an insulating layer, and electrically connected to a driving circuit portion 30. A driving terminal portion DTP of the driving circuit portion 30 may be electrically connected to the pad portion PAD.

The driving circuit portion 30 may be configured to transfer signals of a controller (not shown) or power to the pad portion PAD. The controller may be configured to respectively provide the driving voltage ELVDD and the common voltage ELVSS to the driving voltage supply line 11 and the common voltage supply line 13 through a connection line.

A data driving circuit 32 is electrically connected to the data line DL. Data signals of the data driving circuit 32 may be provided to each sub-pixel P through the connection line and the data line DL, wherein the connection line is connected to the pad portion PAD, and the data line DL is connected to the connection line. Though it is shown in FIG. 3A that the data driving circuit 32 is arranged in the driving circuit portion 30, the data driving circuit 32 may be disposed on the substrate 100 in another embodiment. As an example, the data driving circuit 32 may be arranged between the pad portion PAD and the driving voltage supply line 11.

Though it is shown in FIG. 3A that one driving circuit portion 30 is attached to the pad portion PAD, a plurality of driving circuit portions 30 may be attached to the pad portion PAD as shown in FIG. 3B. The pad portion PAD may be arranged along two sides of the substrate 100. The pad portion PAD may include a plurality of sub-pad portions PADS. The driving circuit portions 30 may be attached to each of the sub-pad portions PADS, respectively.

Figure 4:
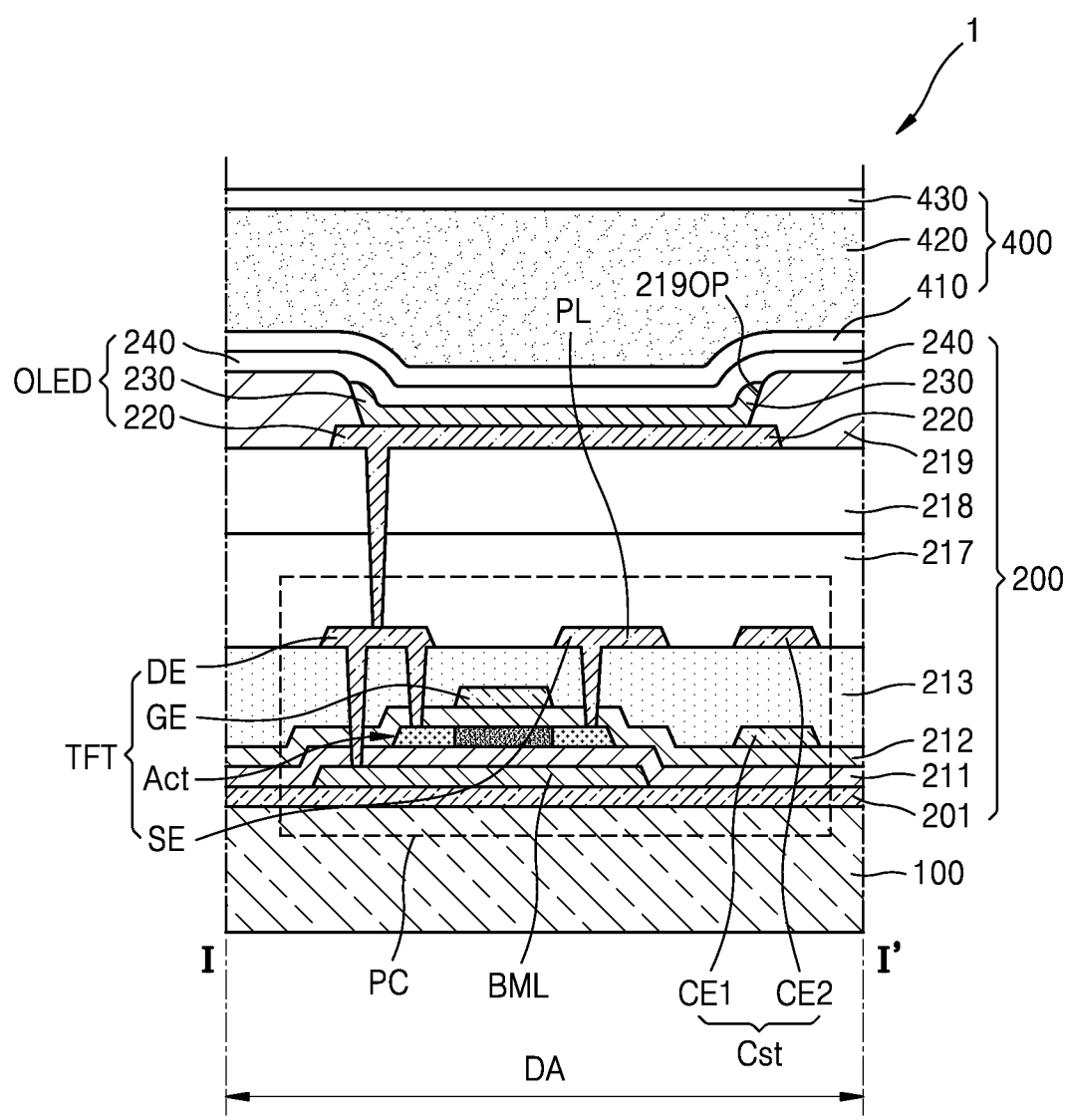
FIG. 4 is a cross-sectional view of a display area taken along line I-I' of FIG. 3A according to an embodiment.

FIG. 4 is a cross-sectional view of a portion of the display area DA of the display apparatus 1 according to an embodiment. FIG. 4 is a cross-sectional view of the display area DA taken along line I-I' of FIG. 3A.

Referring to FIG. 4, the display apparatus 1 may include the display layer 200 and the encapsulation layer 400 covering the display layer 200, wherein the display layer 200 is on the substrate 100. The display layer 200 may include a sub-pixel circuit PC and an organic light-emitting diode OLED connected thereto. It is shown in FIG. 4 that the sub-pixel circuit PC includes a thin-film transistor TFT and a storage capacitor Cst.

The substrate 100 may include glass or polymer resin. A first buffer layer 201 may be disposed on the substrate 100. The first buffer layer 201 may block foreign materials or moisture penetrating through the substrate 100. As an example, the first buffer layer 201 may include an inorganic insulating material such as silicon oxide, silicon nitride, and silicon oxynitride, and include a single layer or a multi-layer.

A bias electrode BML may be disposed on the first buffer layer 201. A voltage may be applied to the bias electrode BML. The bias electrode BML may overlap a semiconductor layer Act of the thin-film transistor TFT, and block external light reaching the semiconductor layer Act. Accordingly, the characteristics of the thin-film transistor TFT may be stabilized. In another embodiment, the bias electrode BSM may be omitted.

A second buffer layer 211 may cover the bias electrode BML. The second buffer layer 211 may be disposed over the entire region of the substrate 100. The second buffer layer 211 may include an inorganic material such as silicon nitride and silicon oxynitride, and have a single-layered structure or a multi-layered structure.

The semiconductor layer Act may be disposed on the second buffer layer 211. The semiconductor layer Act may include polycrystalline silicon, amorphous silicon, an oxide semiconductor, an organic semiconductor material, or the like. In an embodiment, the semiconductor layer Act may include a channel region, a source region, and a drain region, wherein the channel region overlaps a gate electrode GE, and the source region and the drain region are respectively arranged on two opposite sides of the channel region and include impurities of a higher concentration than that of the channel region. The impurities may include N-type impurities or P-type impurities.

A gate insulating layer 212 may cover the semiconductor layer Act. The gate insulating layer 212 may include an inorganic insulating material such as silicon oxide, silicon nitride, silicon oxynitride, aluminum oxide, titanium oxide, tantalum oxide, hafnium oxide, and/or zinc oxide. The gate insulating layer 212 may include a single layer or a multi-layer. The gate electrode GE may be disposed on the gate insulating layer 212. The gate electrode GE may include a conductive material including molybdenum (Mo), aluminum (Al), copper (Cu), and titanium (Ti) and include a single layer or a multi-layer including the above materials.

A first capacitor electrode CE1 of the storage capacitor Cst may be disposed on the same layer as the gate electrode GE. The first capacitor electrode CE1 may include the same material as that of the gate electrode GE.

An interlayer insulating layer 213 may cover the gate electrode GE and the first capacitor electrode CE1 of the storage capacitor Cst. The interlayer insulating layer 213 may include an inorganic insulating material such as silicon oxide, silicon nitride, silicon oxynitride, aluminum oxide, titanium oxide, tantalum oxide, hafnium oxide, and/or zinc oxide. The interlayer insulating layer 213 may include a single layer or a multi-layer.

The source electrode SE, the drain electrode DE, a second capacitor electrode CE2 of the storage capacitor Cst, and the driving voltage line PL may be disposed on the interlayer insulating layer 213. The source electrode SE, the drain electrode DE, the second capacitor electrode CE2, and the driving voltage line PL may include at least one of aluminum (Al), copper (Cu), and titanium (Ti), and include a single layer or a multi-layer. In an embodiment, the source electrode SE, the drain electrode DE, the second capacitor electrode CE2, and the driving voltage line PL may have a multi-layered structure of Ti/Al/Ti. The source electrode SE and the drain electrode DE may be connected to the source region disposed on one end of the semiconductor layer Act and the drain region disposed on the other end of the semiconductor layer Act through contact holes penetrating the gate insulating layer 212 and the interlayer insulating layer 213, respectively. The drain electrode DE may be connected to the bias electrode BML through a contact hole penetrating the second buffer layer 211, the gate insulating layer 212, and the interlayer insulating layer 213. The source electrode SE may be connected to the driving voltage line PL.

The second capacitor electrode CE2 of the storage capacitor Cst may overlap the first capacitor electrode CE1 with respect to the interlayer insulating layer 213 disposed therebetween, and constitute a capacitance. In this case, the interlayer insulating layer 213 may serve as a dielectric layer of the storage capacitor Cst. The thickness of the interlayer insulating layer 213 may be designed according to a value of the capacitance of the storage capacitor Cst.

A first planarization layer 217 may be disposed to cover the source electrode SE, the drain electrode DE, a second capacitor electrode CE2 of the storage capacitor Cst, and the driving voltage line PL. A second planarization layer 218 may be disposed on the first planarization layer 217.

Each of the first planarization layer 217 and the second planarization layer 218 may include an organic material. The first planarization layer 217 and the second planarization layer 218 may each include one of organic insulating materials including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. In an embodiment, one of the first planarization layer 217 and the second planarization layer 218 may be omitted.

The organic light-emitting diode OLED may be disposed on the second planarization layer 218. The organic light-emitting diode OLED may include a pixel electrode 220, an intermediate layer 230, and an opposite electrode 240, wherein the intermediate layer 230 includes an emission layer.

The pixel electrode 220 may be electrically connected to the drain electrode DE through a contact hole penetrating the first planarization layer 217 and the second planarization layer 218. The pixel electrode 220 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. Alternatively, the pixel electrode 220 may further include a conductive oxide material layer on and/or under the reflective layer. The conductive oxide material layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the pixel electrode 220 may have a three-layered structure of ITO/Ag/ITO.

A bank layer 219 may be disposed on the pixel electrode 220 and the second planarization layer 218. A first opening 2190P that exposes at least a portion of the pixel electrode 220 may be defined in the bank layer 219. The central portion of the pixel electrode 220 may be exposed through the first opening 2190P defined in the bank layer 219. The first opening 2190P may define an emission area of light emitted from the organic light-emitting diode OLED. The bank layer 219 may include an organic insulating material such as polyimide or hexamethyldisiloxane. In another embodiment, the bank layer 219 may include an inorganic insulating material such as silicon nitride, silicon oxynitride, or silicon oxide. In another embodiment, the bank layer 219 may include an organic insulating material and an inorganic insulating material.

The intermediate layer 230 may include the emission layer. A hole injection layer (HIL) and/or a hole transport layer (HTL) may be disposed between the pixel electrode 220 and the emission layer. An electron transport layer (ETL) and/or an electron injection layer (EIL) may be disposed between the emission layer and the opposite electrode 240.

The emission layer may include a low-molecular weight material or a polymer material, and emit red, green, blue, or white light. In the case where the emission layer includes a low molecular weight material, the intermediate layer 230 may have a structure in which a hole injection layer, a hole transport layer, an emission layer, an electron transport layer, an electron injection layer, etc., are stacked in a single or composite structure. The emission layer may include various organic materials such as copper phthalocyanine (CuPc), N, N'-Di (naphthalene-1-yl)-N, N'-diphenyl-benzidine, and tris-8-hydroxyquinoline aluminum (Alq3).

In the case where the emission layer include a polymer material, the intermediate layer 230 may have a structure including the hole transport layer and the emission layer. The emission layer may include a polymer material such as a polyphenylene vinylene (PPV)-based material and a polyfluorene-based material.

Though it is shown in FIG. 4 that the emission layer is patterned to correspond to each of the plurality of pixel electrodes 220, the embodiment is not limited thereto. In an embodiment, the emission layer may be formed as one body over the plurality of pixel electrodes 220.

The opposite electrode 240 may be disposed on the intermediate layer 230. The opposite electrode 240 may be a light transmissive electrode or a reflective electrode. In an embodiment, the opposite electrode 240 may be a transparent or semi-transparent electrode and may include a metal thin film including Li, Ca, LiF/Ca, LiF/Al, Al, Ag, Mg, or compound thereof and having a small work function. In addition, a transparent conductive oxide (TCO) layer such as ITO, IZO, ZnO, or $In_2O_3$ may be further arranged on the metal thin film. The opposite electrode 240 may extend to not only the display area DA but also the peripheral area PA as shown in FIG. 3A.

The organic light-emitting diode OLED may be covered by the encapsulation layer 400. In an embodiment, the encapsulation layer 400 may include a first inorganic encapsulation layer 410, a second inorganic encapsulation layer 430, and an organic encapsulation layer 420 disposed therebetween. In another embodiment, the number of organic encapsulation layers, the number of inorganic encapsulation layers, and a stacking order may be changed.

The first and second inorganic encapsulation layers 410 and 430 may include at least one inorganic material from among aluminum oxide, titanium oxide, tantalum oxide, hafnium oxide, zinc oxide, silicon oxide, silicon nitride, and silicon oxynitride. The first and second inorganic encapsulation layers 410 and 430 may each include a single layer or a multi-layer including the above materials.

The organic encapsulation layer 420 may include a monomer-based material and/or a polymer-based material. The polymer-based material may include, for example, acryl-based resin, epoxy-based resin, polyimide, and polyethylene. The organic encapsulation layer 420 may be sealed from the outside by the first and second inorganic encapsulation layers 410 and 430 disposed under and on the organic encapsulation layer 420. As described specifically below, because the organic encapsulation layer 420 is blocked by a dam DAM (see FIG. 5C) in the peripheral area PA during the process of manufacturing the display apparatus 1, the organic encapsulation layer 420 may not overflow toward the edge of the substrate 100.

Figure 5:
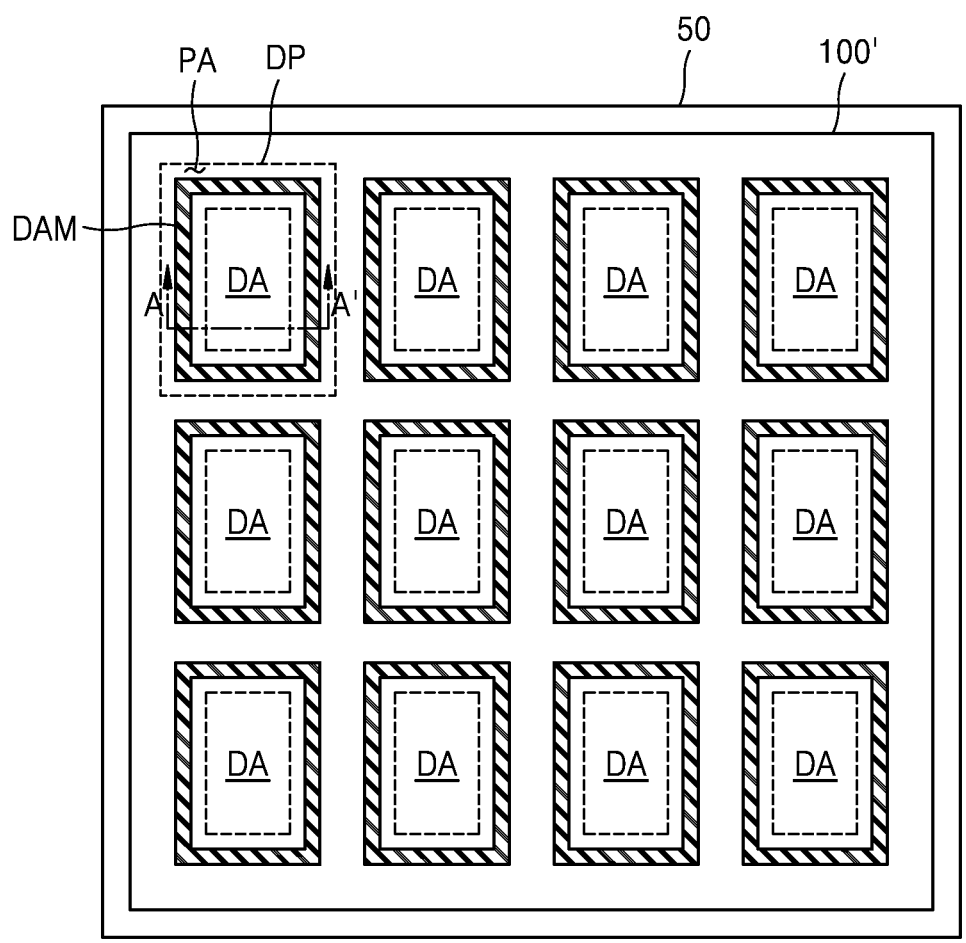
FIG. 5 is a plan view showing a portion of a method of manufacturing a display apparatus according to an embodiment.
Figure 6:
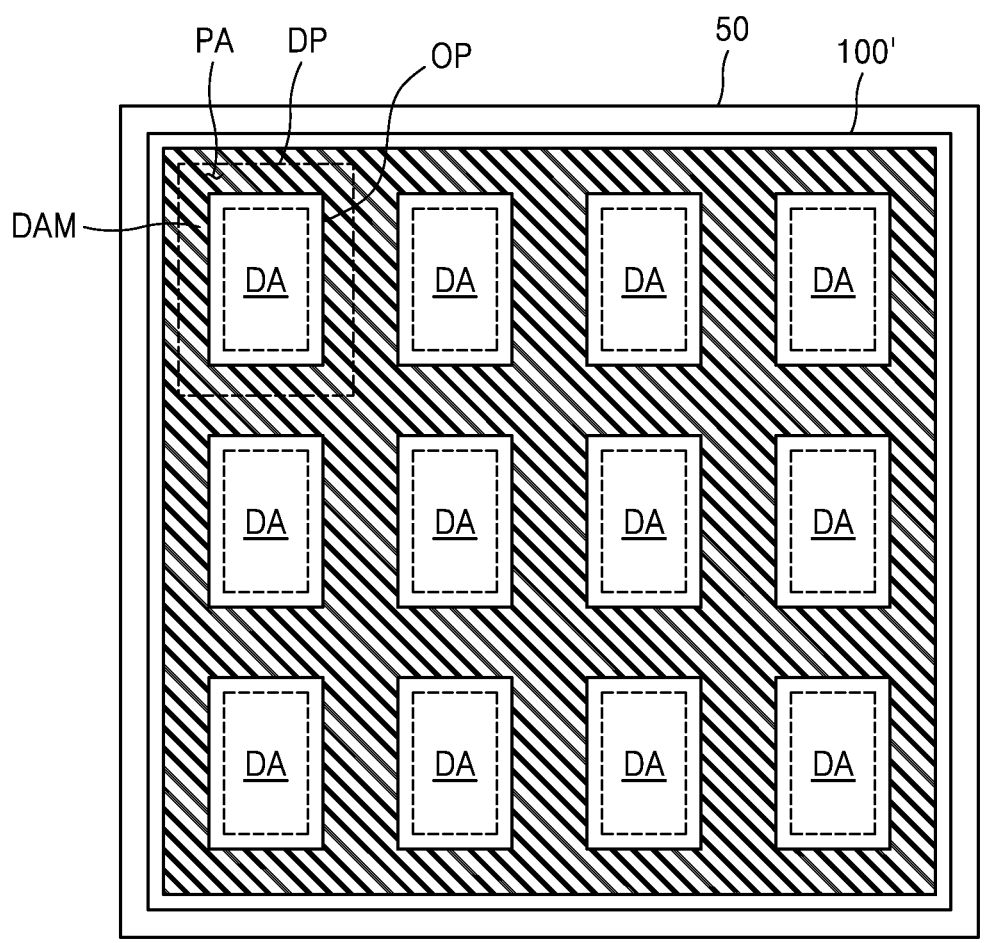
FIG. 6 is a plan view showing a portion of a method of manufacturing a display apparatus according to another embodiment.

FIG. 5 is a plan view of a portion of a method of manufacturing the display apparatus 1 according to an embodiment. FIG. 6 is a plan view showing a modified embodiment of FIG. 5. FIGS. 7A, 7B, 7C, and 7D are schematic cross-sectional views of a method of manufacturing the display apparatus 1 according to an embodiment, and FIGS. 7A, 7B, 7C, and 7D are cross-sectional views showing the method of manufacturing the display apparatus taken along line A-A' of FIG. 5.

Figure 7A:
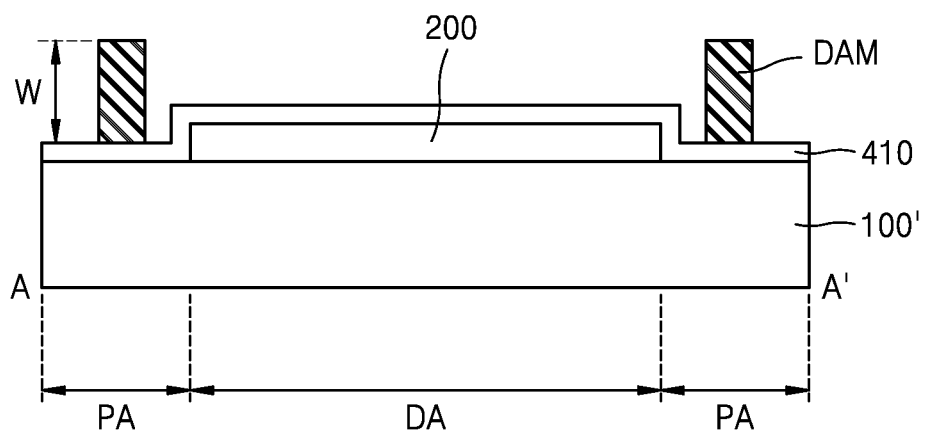
FIGS. 7A, 7B, 7C, and 7D are cross-sectional views showing a method of manufacturing a display apparatus taken along line A-A' of FIG. 5 according to an embodiment.

Referring to FIGS. 5, 6, and 7A, during the process of manufacturing the display apparatus 1, a plurality of display panels DP may be simultaneously stacked on a mother substrate 50. Then, each of the plurality of display panels DP may be simultaneously cut. After cutting, each of the plurality of display panels DP formed on the mother substrate 50 may be produced as shown in FIG. 3A included in each of the display apparatuses 1. The mother substrate 50 is a substrate serving as a base for supporting a structure during the process of manufacturing the display apparatus 1, and may include, for example, glass. However, the mother substrate 50 is removed during a process of manufacturing the display apparatus 1.

A base layer 100' serving as the substrate 100 (see FIG. 3) of the display panel DP, may be formed on the substrate 50. The base layer 100' may be formed as one body on the mother substrate 50 to form the plurality of display panels DP.

The display layer 200 may be formed on the base layer 100'. A region of the base layer 100' in which the display layer 200 overlaps may correspond to the display area DA. An outer region of the display area DA in which the display layer 200 does not overlap may correspond to the peripheral area PA. Though not shown in FIG. 2, a portion of an insulating layer, for example, an inorganic insulating layer of the display layer 200, may extend to the peripheral area PA.

Referring to FIG. 5, the dam DAM may be formed in the peripheral area PA. The dam DAM may be formed to prevent an organic layer-forming material from diffusing toward the edges of the substrate 100 (see FIG. 3A) during a process of forming an organic layer OIL of the display panel DP, and restrict a formation position of the organic layer OIL.

In this case, the organic layer OIL may be arranged to correspond to the display area DA entirely, and arranged in a portion of the peripheral area PA. The organic layer OIL may be disposed on the display layer 200 of the display panel DP, for example, on the light-emitting diode. As an example, the organic layer OIL may be the organic encapsulation layer 420. Hereinafter, though the organic layer OIL is described as an example of the organic encapsulation layer 420 of the encapsulation layer 400, the embodiment is not limited thereto. In an embodiment, the organic layer OIL may be the overcoat layer included in the upper structure 500 (see FIG. 2). The dam DAM may be formed on the base layer 100'. As an example, in the case where the organic layer OIL is the organic encapsulation layer 420, the dam DAM may be formed on the first inorganic encapsulation layer 410 as shown in FIG. 7A.

In an embodiment, an operation of forming the dam DAM may include coating a pattern over the base layer 100' by using a dam-forming material, wherein the dam-forming material includes a photodegradable material, and drying the dam-forming material that is patterned.

The dam-forming material may include the photodegradable material. In an embodiment, the photodegradable material may be a positive photoresist. When exposed to light, the positive photoresist may be decomposed. The positive photoresist allows an exposed area to be soluble to a developer. That is, the rest of regions except for the exposed region may remain after a developing process.

Referring to FIG. 5, the dam DAM may be formed to surround at least a portion of the display area DA along the edges of the display area DA in a plan view. That is, the dam DAM may be individually formed along the edges of the display area DA included in each of the plurality of display panels DP. In this case, an operation of forming the pattern by using the dam-forming material, may be performed by using, for example, line drawing or a silk screen method. However, the embodiment is not limited thereto.

In another embodiment, referring to FIG. 6, the dam DAM may be formed to have a plane shape. In this case, an opening OP corresponding to the display area DA in a plan view is formed in the dam DAM. In an embodiment, in a plan view, the edges of the opening OP may be formed along the edges of the display area DA. The dam DAM may be formed as one body with respect to the plurality of display panels DP. In this case, an operation of coating the dam-forming material and forming a pattern, may be performed by, for example, the silk screen method or a method of coating the dam-forming material and then irradiating light to the dam-forming material. As an example, in the case where the pattern is formed by using the latter method, because the dam-forming material includes the photodegradable material, for example, a positive photoresist, a region corresponding to a transmissive region of the mask may be removed during a developing process. The transmissive region of the mask may include a region corresponding to the opening OP.

The operation of drying the dam-forming material that is patterned may be an operation of removing solvent included in the dam-forming material by using pre-bake and the like. The dam-forming material that is dried may be fixed without flowing.

A thickness W of the dam DAM may be formed by taking into account the thickness of the organic layer OIL. As an example, the thickness W of the dam DAM may be about 0.8 times to about 10 times the thickness of the organic layer OIL. As described below, because the dam DAM is temporarily formed and removed during the process of manufacturing the display apparatus 1, the dam DAM may be formed to have a relatively large thickness.

Figure 7B:
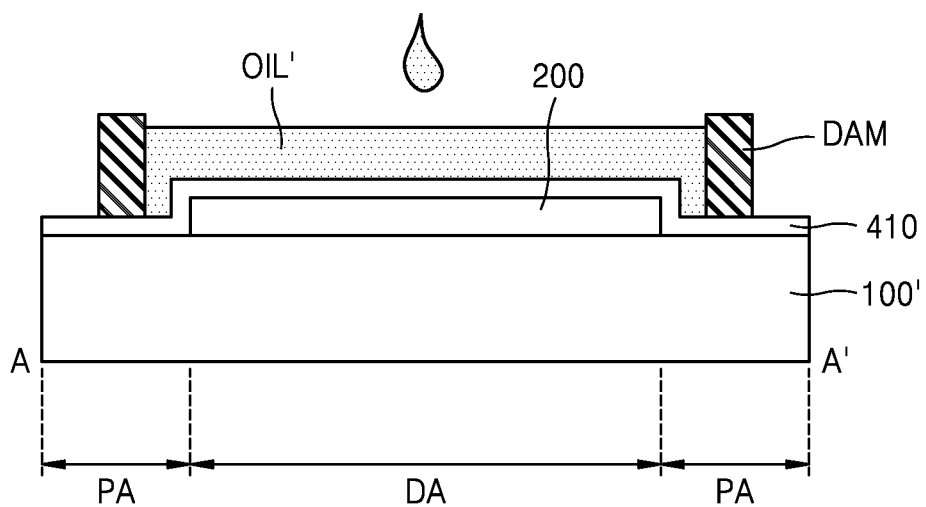
Figure 7C:
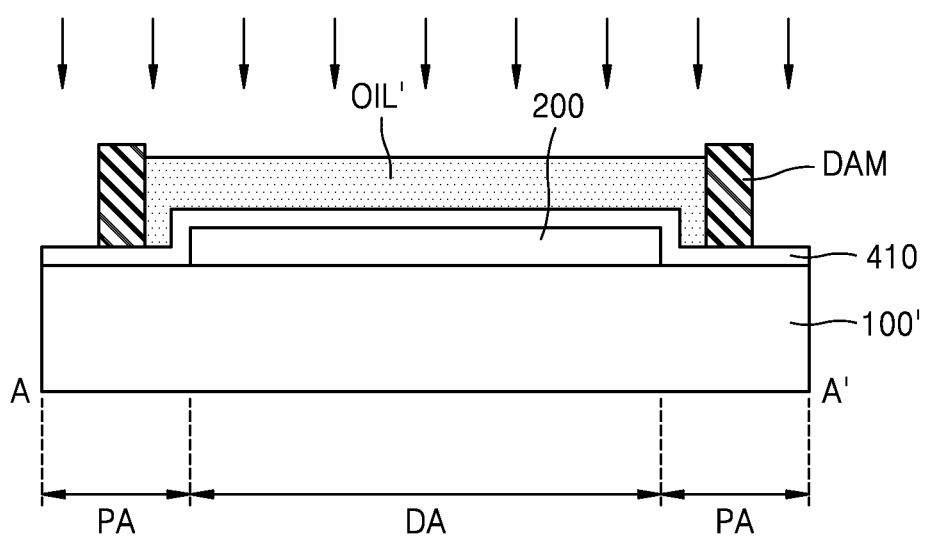

Referring to FIGS. 7B and 7C, the organic layer OIL may be formed in the inner region of the dam DAM, the organic layer OIL including the photocurable material. In an embodiment, the organic layer OIL may be formed by using an inkjet method that uses nozzles. However, the embodiment is not limited thereto.

In the present embodiment, the operation of forming the organic layer OIL may include: injecting an organic layer-forming material in the inner region of the dam DAM, the organic layer-forming material including a photocurable material, and irradiating light and curing the organic layer-forming material that is injected.

The organic layer-forming material may include the photocurable material. In an embodiment, the photocurable material may be a negative photoresist. The negative photoresist may have opposite properties to those of a positive photoresist. The negative photoresist may be cured by a polymerization reaction when exposed to light. In the negative photoresist, the exposed areas may remain after the developing process.

As described above, the dam DAM may serve as a barrier for preventing the organic layer-forming material having fluidity from flowing out. The inner region of the dam DAM may include a region in which the organic layer OIL is formed. In an embodiment, the inner region of the dam DAM may directly contact the organic layer-forming material.

The operation of curing the organic layer-forming material may be performed by irradiating light such as an ultraviolet (UV) ray and the like. The operation may be performed by irradiating light to the entire surface of the base layer 100'. In the case where the organic layer-forming material includes the photocurable material, for example, the negative photoresist, the organic layer-forming material may be cured by the irradiated light.

During this process, the dam DAM may be decomposed. That is, the operation of decomposing the dam DAM may be simultaneously performed simultaneously with the operation of curing the organic layer-forming material. In the case where the dam DAM includes the photodegradable material, for example, the positive photoresist, because the positive photoresist has the opposite properties to those of the negative photoresist, the dam DAM may be decomposed by the irradiated light. That is, the dam DAM irradiated with light may be changed into a material soluble in a developer. As described above, the dam DAM may not be decomposed/removed in a separate process, but may be simultaneously decomposed during the process of curing the organic layer-forming material and forming the organic layer OIL.

Figure 7D:
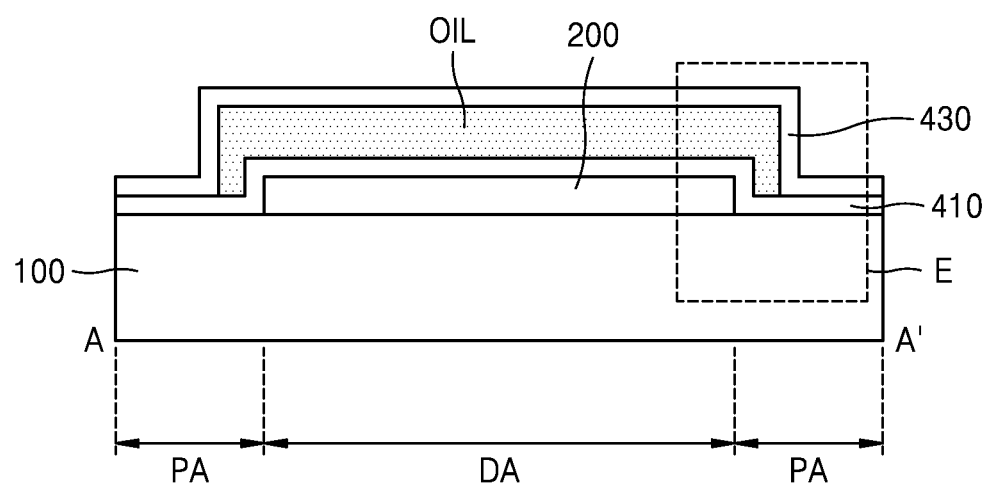
Figure 8:
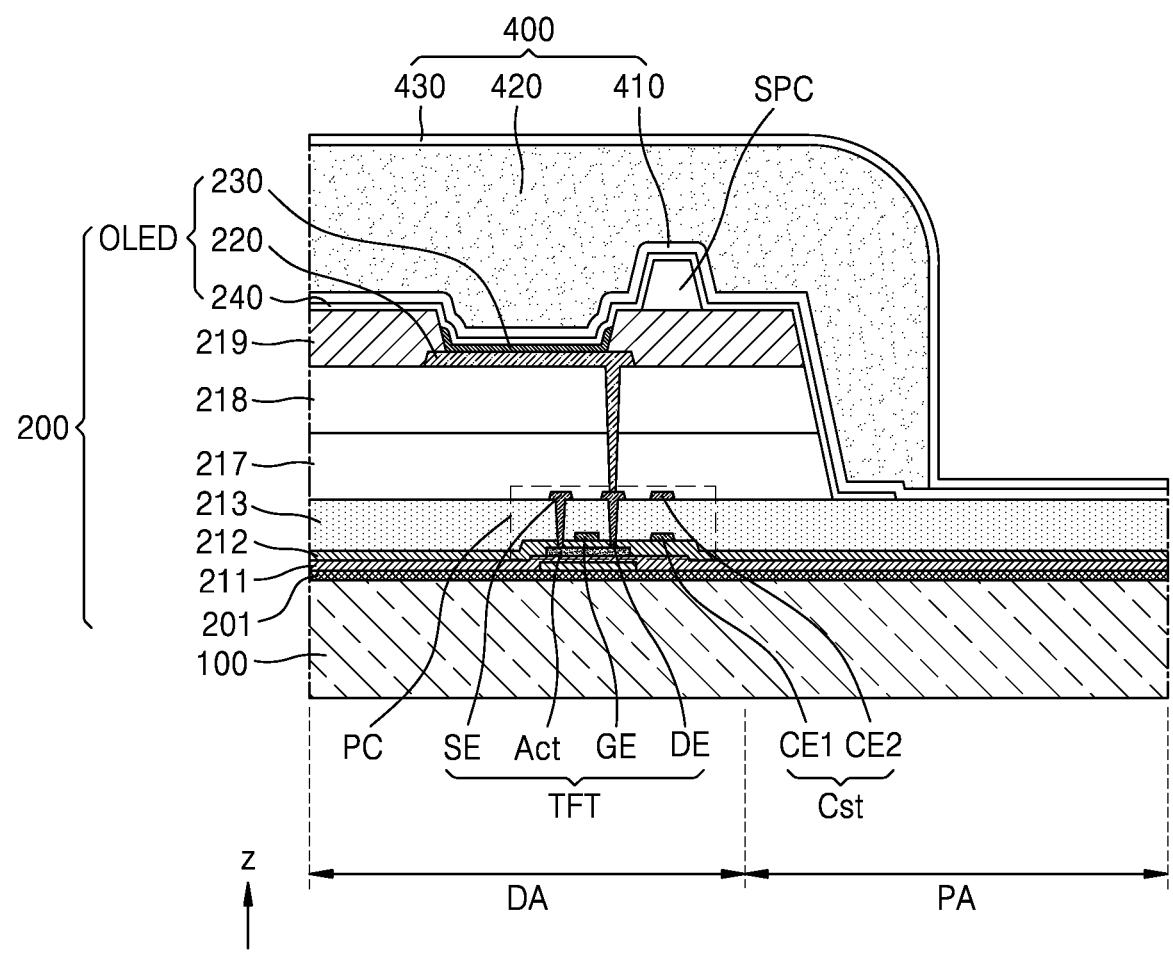
FIG. 8 is an enlarged cross-sectional view of a region E of FIG. 7D according to an embodiment.

Referring to FIG. 7D, the dam DAM that is decomposed may be removed. The dam DAM that is decomposed may be developed by using a developer. The dam DAM that is decomposed may be removed by being dissolved in a developer. In addition, residues of the dam DAM may be removed using a washing solution. FIG. 8 shows the case where the organic layer OIL corresponds to the organic encapsulation layer 420. The dam DAM is removed, and then the second inorganic encapsulation layer 430 may be formed on the organic layer OIL.

As described with reference to FIGS. 7A, 7B, 7C, and 7D, the dam DAM may be temporarily formed and removed during the process of manufacturing the display apparatus 1. That is, in the display apparatus 1 manufactured according to an embodiment, the dam DAM may not remain. In this case, because the peripheral area PA in which the dam DAM is formed, does not need to be designed wide, a dead space of the display apparatus 1 may be reduced and the display area DA may be increased. In addition, because the dam DAM is temporarily formed, an issue that a portion of the dam DAM exfoliates due to a physical influence and moves toward the display area DA during the manufacturing process, and thus defects occur, may be prevented.

FIG. 8 is a cross-sectional view of a portion of the display apparatus 1 according to an embodiment. FIG. 8 is an enlarged cross-sectional view of a region E of FIG. 7D.

The display apparatus 1 may include the display area DA and the peripheral area PA. The structure of the display area DA is the same as that described with reference to FIG. 4.

The display panel DP may include the substrate 100, the display layer 200, and the encapsulation layer 400. The display layer 200 may be disposed on the substrate 100. The display layer 200 may include the sub-pixel circuit PC, the first buffer layer 201, the second buffer layer 211, the gate insulating layer 212, the interlayer insulating layer 213, the first planarization layer 217, the second planarization layer 218, the bank layer 219, and the organic light-emitting diode OLED. The sub-pixel circuit PC includes the thin-film transistor TFT and a storage capacitor Cst.

The thin-film transistor TFT may include the semiconductor layer Act, the gate electrode GE, the source electrode SE, and the drain electrode DE. The storage capacitor Cst may include the first capacitor electrode CE1 and the second capacitor electrode CE2. The organic light-emitting diode OLED may include the pixel electrode 220, the intermediate layer 230, and the opposite electrode 240.

In FIG. 8, a spacer SPC may be further arranged on the bank layer 219. The spacer SPC may be disposed on the bank layer 219. The spacer SPC may include an organic insulating material such as polyimide. Alternatively, the spacer SPC may include an inorganic insulating material, or an organic insulating material and an inorganic insulating material. The spacer SPC may include a different material from that of the bank layer 219, or the same material as that of the bank layer 219.

The encapsulation layer 400 includes the first inorganic encapsulation layer 410, the organic encapsulation layer 420, and the second inorganic encapsulation layer 430. As described with reference to FIGS. 7C and 7D, the dam DAM is removed, and then the second inorganic encapsulation layer 430, which is the organic layer OIL, is formed, and the lateral surface of the organic encapsulation layer 420 that contacts the inner surface of the dam DAM, may be covered entirely by the second inorganic encapsulation layer 430.

In this case, the lateral surface of the organic encapsulation layer 420 may have the substantially same shape as the inner surface of the dam DAM that is removed. In the case where the inner surface of the dam DAM has a preset angle with respect to the lower surface, the lateral surface of the organic encapsulation layer 420 may represent the substantially same angle as the angle with respect to the lower surface. As an example, the lateral surface of the dam DAM described with reference to FIG. 7D may be formed to have about 90° with respect to the lower surface, and the lateral surface of the organic encapsulation layer 420 shown in FIG. 8 may have a shape standing at about 90° with respect to the lower surface.

As a comparative example, the display apparatus may include a dam for preventing an overflow of the organic layer. The dam may be formed by stacking organic layers, for example, the layers located under the organic encapsulation layer, for example, the same layers as the first planarization layer, the second planarization layer, the bank layer, and/or the spacer. Because the thickness of the dam is limited by the lower layers, the thickness of the dam may not be sufficient, and there is a risk that the organic layer-forming material may overflow out of the dam. Accordingly, an auxiliary dam arranged to surround the dam in a plan view, may be formed. In this case, in the display apparatus according to a comparative example, a dead space may increase. In addition, because the dam is formed by stacking many layers, it may be difficult to uniformly form the thickness of the dam entirely.

In the display apparatus 1 according to an embodiment, the dam DAM (see FIG. 7D) is removed during the manufacturing process and may not remain in a final product. In addition, the dam DAM is not formed by stacking the layers under the organic layer OIL (see FIG. 7D), for example, the organic encapsulation layer 420, but formed by a separate process. Accordingly, because the thickness of the dam DAM is not restricted to the thickness of the lower layers, there is an advantage that the dam DAM may be formed to have a sufficient thickness that may prevent the overflow of the organic layer OIL.

FIGS. 9A, 9B, 9C, 9D, and 9E are cross-sectional views showing a method of manufacturing a display apparatus according to another embodiment. FIGS. 9A, 9B, 9C, 9D, and 9E are cross-sectional views showing a method of manufacturing a display apparatus taken along line A-A' of FIG. 5 according to another embodiment. In FIGS. 9A, 9B, 9C, 9D, and 9E, except for the organic layer OIL and the display layer 200, constructions that may be arranged between the organic layer OIL and the display layer 200 are omitted.

Referring to FIGS. 9A, 9B, 9C, 9D, and 9E, an embodiment is different from the above embodiment in that the organic layer OIL in which a plurality of layers are successively deposited, is manufactured. Hereinafter, differences in an aspect of the process, discriminated from FIGS. 7A, 7B, 7C, and 7D, are mainly described. The organic layer OIL may include a first organic layer OIL1 and a second organic layer OIL2. The second organic layer OIL2 may be disposed directly on the first organic layer OIL1. The organic layer OIL may be, for example, the overcoat layer that may be included in the upper structure 500 (see FIG. 2).

In an embodiment, the first organic layer OIL1 and the second organic layer OIL2 may include different materials. However, the embodiment is not limited thereto. In an embodiment, the first organic layer OIL1 and the second organic layer OIL2 may include the same material. As an example, in the case where the organic layer OIL is the overcoat layer, the organic layer OIL may be formed by successively stacking organic layers including the same material to sufficiently cover the structures thereunder.

Figure 9A:
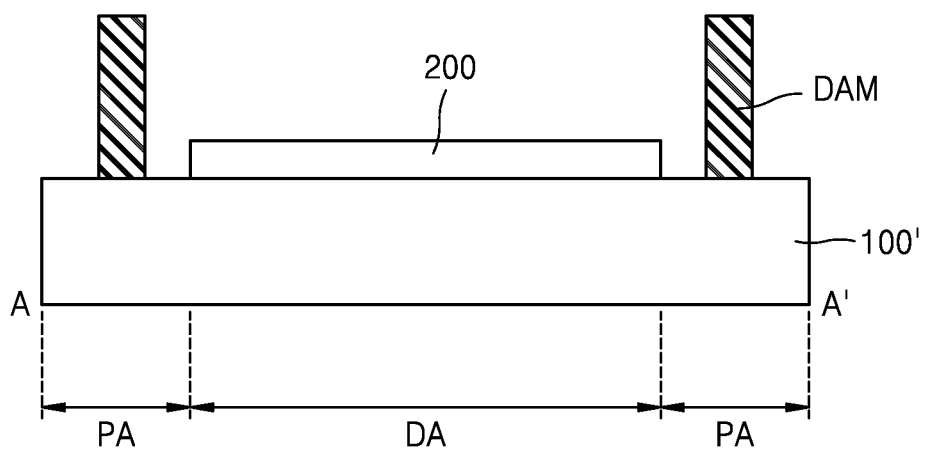
FIGS. 9A, 9B, 9C, 9D, and 9E are cross-sectional views showing a method of manufacturing a display apparatus taken along line A-A' of FIG. 5 according to another embodiment.

Referring to FIG. 9A, the dam DAM including the photodegradable material may be formed in the peripheral area PA. The thickness of the dam DAM may be formed by taking into account the thickness of the organic layer OIL. The thickness of the dam DAM may be about 0.8 times to about 10 times the thickness of the organic layer OIL in total. As an example, the thickness of the dam DAM may be about 0.8 times to about 10 times a sum of the thickness of the first organic layer OIL1 and the second organic layer OIL2.

Figure 9B:
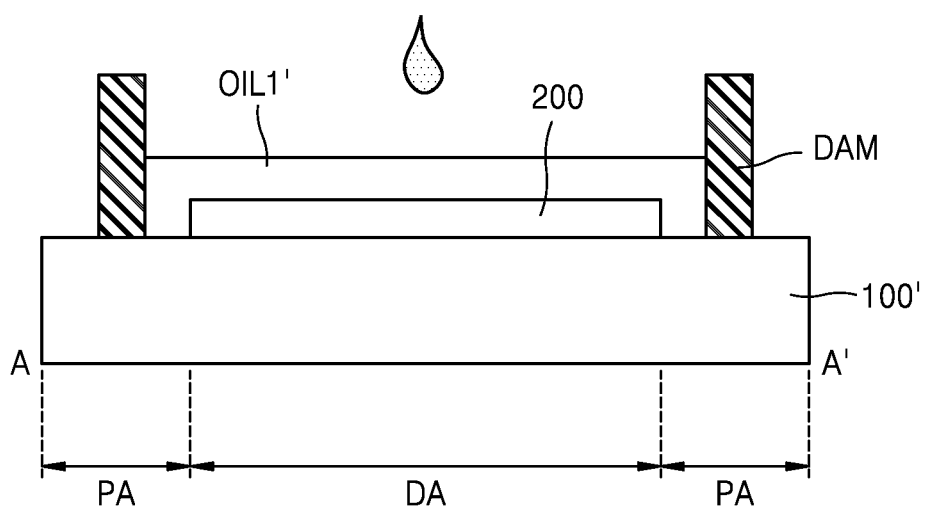
Figure 9C:
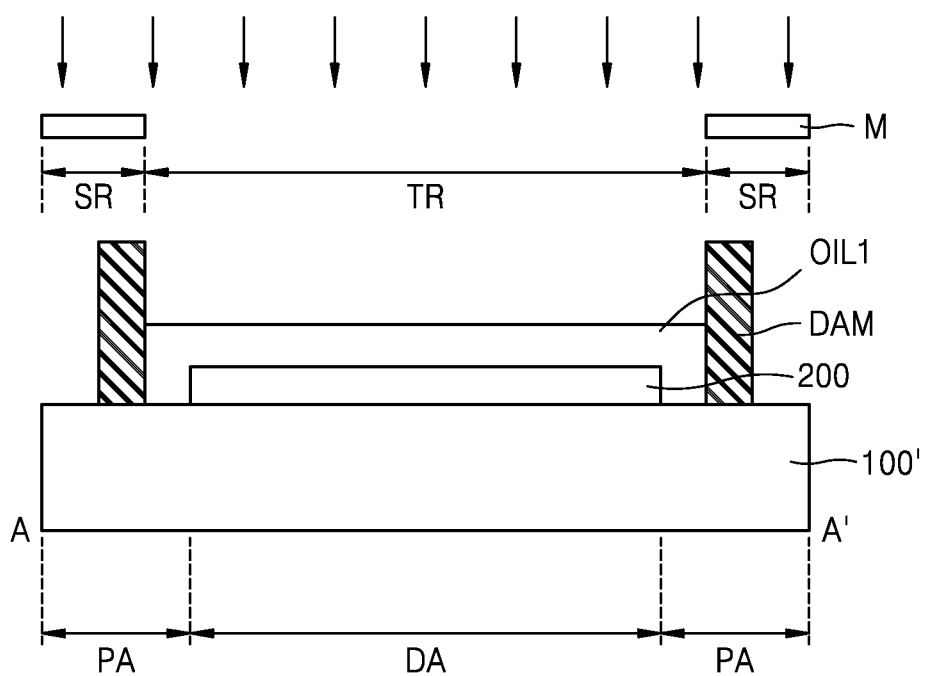

Referring to FIGS. 9B and 9C, the first organic layer OIL1 may be formed in the inner region of the dam DAM, the first organic layer OIL1 including the photocurable material. The first organic layer OIL1 may be formed by an inkjet method. The operation of forming the first organic layer OIL1 may be performed by injecting a first organic layer-forming material OIL1' in the inner region of the dam DAM and irradiating light and curing the first organic layer-forming material OIL1'. The first organic layer-forming material OIL1' may include the photocurable material. The photocurable material may include, for example, a negative photoresist.

The operation of curing the first organic layer-forming material OIL1' may be performed by an exposure process that uses a mask M. The operation of curing the first organic layer-forming material OIL1' may include preparing the mask M including a transmissive region TR and a light-blocking region SR, aligning the mask M such that the light transmissive region TR corresponds to the first organic layer-forming material OIL1', and the light-blocking region SR corresponds to the dam DAM, and irradiating light.

The mask M may include the light-blocking region SR that blocks light and the light transmissive region TR that transmits light. Because the light transmissive region TR corresponds to the first organic layer-forming material OIL1', when light is irradiated, light that passes through the light transmissive region TR may cure the first organic layer-forming material OIL1'. The first organic layer-forming material OIL1' may be cured, and the first organic layer OIL1 may be formed. In contrast, because the light-blocking region of the mask M corresponds to the dam DAM, the dam DAM may not be exposed to light. Accordingly, the dam DAM may not be removed while the first organic layer OIL1 is formed.

Figure 9D:
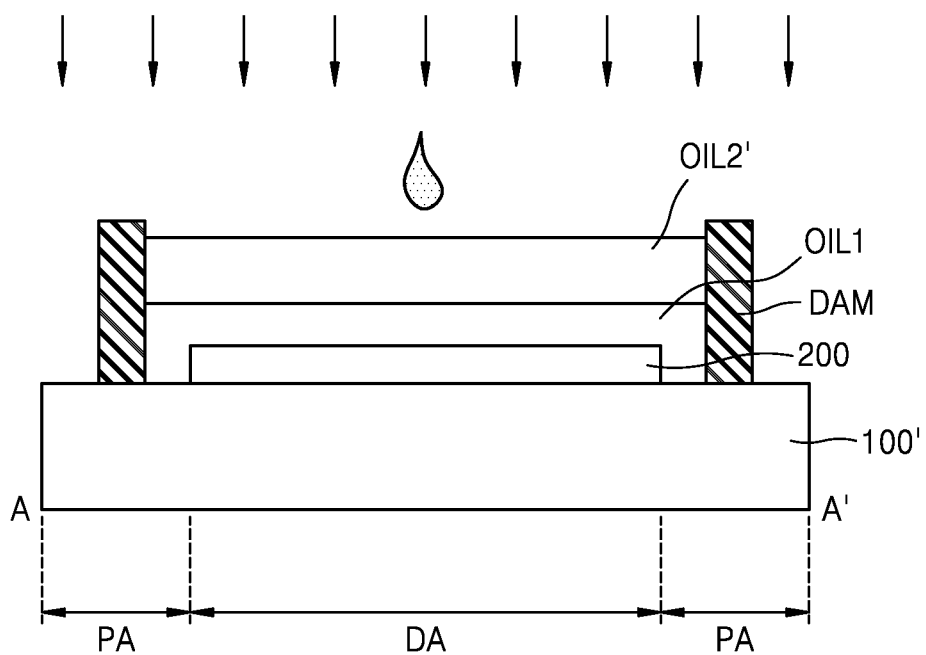
Figure 9E:
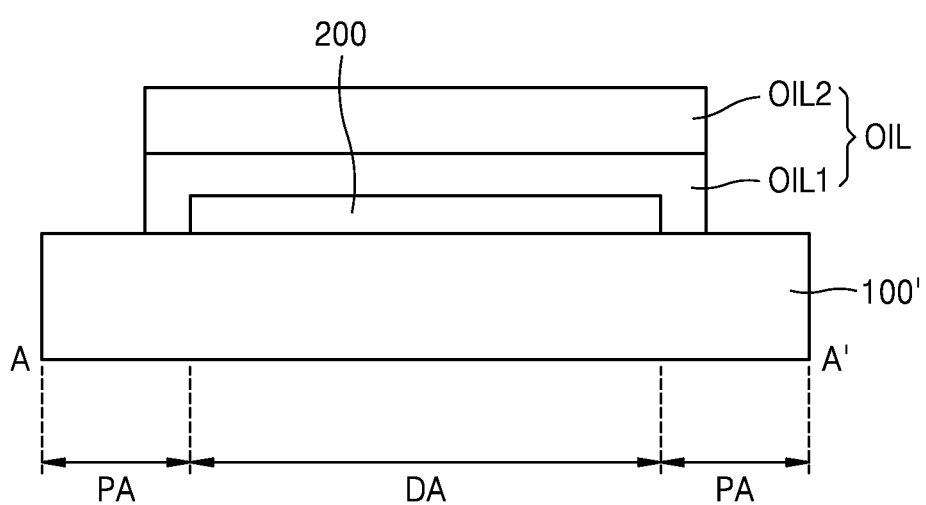

Referring to FIGS. 9D and 9E, the second organic layer OIL2 including the photocurable material, may be formed on the first organic layer OIL1 in the inner region of the dam DAM. The second organic layer OIL2 may be formed by an inkjet method that uses nozzles. The operation of forming the second organic layer OIL2 may be performed by injecting a second organic layer-forming material OIL2' in the inner region of the dam DAM and irradiating light and curing the second organic layer-forming material OIL2'. The second organic layer-forming material OIL2' may include the photocurable material. The photocurable material may include, for example, a negative photoresist.

The operation of curing the second organic layer-forming material OIL2' may be performed by irradiating light to the entire surface of the base layer 100'. Because the second organic layer-forming material OIL2' includes the photocurable material, the second organic layer-forming material OIL2' may be cured and the second organic layer OIL2 may be formed. During this process, the dam DAM may be decomposed. That is, the operation of decomposing the dam DAM may be simultaneously performed simultaneously with the operation of curing the second organic layer-forming material OIL2'. As described above, because the dam DAM includes the photocurable material and the photodegradable material, for example, the positive photoresist, the dam DAM may be decomposed by light. The dam DAM may not be removed by a separate process but may be simultaneously formed while the second organic layer OIL2 is formed.

The dam DAM that is decomposed may be removed by, for example, the developing process that uses the developer.

According to the embodiments, a method of manufacturing a display apparatus with a reduced defect rate and an increased display area during a manufacturing process, and a display apparatus manufactured through the method, may be provided. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus including a substrate and a light-emitting diode, wherein the substrate includes a display area and a peripheral area disposed outside of the display area, and the light-emitting diode is arranged in the display area, the method comprising steps of:
    forming a dam in the peripheral area, the dam including a photodegradable material;
    forming an organic layer in an inner region of the dam, the organic layer including a photocurable material, wherein the forming of the organic layer is performed by:
    injecting an organic layer-forming material in the inner region of the dam, the organic layer-forming material including the photocurable material, and
    irradiating light and curing the organic layer-forming material that is injected; and
    removing the dam.

2. The method of claim 1, wherein the forming of the dam is performed by:
    coating the substrate with a dam-forming material in order to form a pattern, the dam-forming material including the photodegradable material, and
    drying the dam-forming material that is patterned.

3. The method of claim 2, wherein the coating of the substrate and the forming of the pattern are performed by using line drawing or a silk screen method.

4. The method of claim 2, wherein the coating of the substrate and the forming of the pattern are performed by:
    coating the substrate with the dam-forming material, and
    irradiating light, by using a mask, to the dam-forming material that is coated.

5. The method of claim 1, wherein the dam surrounds the display area along edges of the display area in a plan view.

6. The method of claim 1, wherein an opening corresponding to the display area in a plan view is formed in the dam.

7. The method of claim 1, wherein the forming of the organic layer is performed by using an inkjet method.

8. The method of claim 1, wherein the organic layer is disposed over the light-emitting diode and covers an entirety of the display area.

9. The method of claim 1, wherein the photocurable material includes a negative photoresist.

10. The method of claim 1, wherein the photodegradable material includes a positive photoresist.

11. The method of claim 1, wherein the removing of the dam is performed by:
    decomposing the dam by irradiating light thereon, and
    removing the dam that is decomposed.

12. The method of claim 11, wherein the removing of the dam is simultaneously performed with the curing of the organic layer-forming material.

13. The method of claim 1, wherein a thickness of the dam is about 0.8 times to about 10 times a thickness of the organic layer.

14. A method of manufacturing a display apparatus including a substrate and a light-emitting diode, wherein the substrate includes a display area and a peripheral area disposed outside of the display area, and the light-emitting diode is arranged in the display area, the method comprising steps of:
    forming a dam in the peripheral area, the dam including a photodegradable material;
    forming an organic layer in an inner region of the dam, the organic layer including a photocurable material; and
    removing the dam, wherein the display apparatus further includes a first inorganic encapsulation layer covering the light-emitting diode, a second inorganic encapsulation layer on the first inorganic encapsulation layer, and an organic encapsulation layer disposed between the first inorganic encapsulation layer and the second inorganic encapsulation layer, and
    wherein the organic layer includes the organic encapsulation layer.

15. A method of manufacturing a display apparatus including a substrate and a light-emitting diode, wherein the substrate includes a display area and a peripheral area disposed outside of the display area, and the light-emitting diode is arranged in the display area, the method comprising steps of:
    forming a dam in the peripheral area, the dam including a photodegradable material;
    forming an organic layer in an inner region of the dam, the organic layer including a photocurable material; and
    removing the dam, wherein the organic layer includes a first organic layer and a second organic layer directly disposed on the first organic layer, and
    wherein the forming of the organic layer is performed by forming the first organic layer and forming the second organic layer on the first organic layer.

16. The method of claim 15, wherein the forming of the first organic layer is performed by:
    injecting a first organic layer-forming material in the inner region of the dam, the first organic layer-forming material including a photocurable material, and
    irradiating light to cure the first organic layer-forming material that is injected, and
    wherein the forming of the second organic layer is performed by:
    injecting a second organic layer-forming material in the inner region of the dam, the second organic layer-forming material including a photocurable material, and
    irradiating light to cure the second organic layer-forming material that is injected.

17. The method of claim 16, wherein the curing of the first organic layer-forming material is performed by:
    preparing a mask including a light transmissive region and a light-blocking region,
    aligning the mask such that the light transmissive region corresponds to the first organic layer-forming material, and the light-blocking region corresponds to the dam, and
    irradiating light.

18. The method of claim 17, wherein the removing of the dam is performed by:

decomposing the dam by irradiating light, and
removing the dam that is decomposed, and
wherein the decomposing of the dam is simultaneously performed with the curing of the second organic layer-forming material.

* * * * *